(12) United States Patent
Ku et al.

(10) Patent No.: US 8,616,821 B2
(45) Date of Patent: Dec. 31, 2013

(54) INTEGRATED APPARATUS TO ASSURE WAFER QUALITY AND MANUFACTURABILITY

(75) Inventors: Shao-Yen Ku, Jhubei (TW); Chi-Ming Yang, Hsin-Chu (TW); Ming-Tsao Chiang, Jhubei (TW); Yu-Fen Tzeng, Hsinchu (TW); Chin-Hsiang Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 519 days.

(21) Appl. No.: 12/869,171

(22) Filed: Aug. 26, 2010

(65) Prior Publication Data

US 2012/0051872 A1 Mar. 1, 2012

(51) Int. Cl.
*H01L 21/67* (2006.01)
*H01L 21/677* (2006.01)

(52) U.S. Cl.
CPC ..... *H01L 21/67011* (2013.01); *H01L 21/67155* (2013.01); *H01L 21/677* (2013.01); *H01L 21/67703* (2013.01); *Y10S 414/135* (2013.01); *Y10S 414/139* (2013.01)
USPC ............... 414/222.01; 414/217; 414/217.1; 414/935; 414/939

(58) Field of Classification Search
CPC ..... H01L 21/67; H01L 21/673; H01L 21/677; H01L 21/68; H01L 21/687; H01L 21/67011; H01L 21/6703; H01L 21/67155
USPC ............... 118/64, 68, 718; 414/217, 217.1, 414/222.01, 222.02, 930, 935, 939
See application file for complete search history.

(56) References Cited

U.S. PATENT DOCUMENTS

| | | | | |
|---|---|---|---|---|
| 4,657,620 | A * | 4/1987 | Davis et al. | 156/345.24 |
| 5,609,689 | A * | 3/1997 | Kato et al. | 118/719 |
| 6,202,318 | B1 * | 3/2001 | Guldi et al. | 34/79 |
| 6,444,587 | B1 * | 9/2002 | Lin et al. | 438/714 |
| 6,467,491 | B1 | 10/2002 | Sugiura et al. | |
| 6,566,269 | B1 | 5/2003 | Biles et al. | |
| 6,573,031 | B2 * | 6/2003 | Shinya et al. | 430/325 |
| 6,656,281 | B1 * | 12/2003 | Ueda et al. | 118/695 |
| 6,672,864 | B2 * | 1/2004 | Wang et al. | 432/5 |
| 6,767,775 | B1 * | 7/2004 | Yudasaka et al. | 438/156 |
| 6,797,323 | B1 * | 9/2004 | Kashiwagi et al. | 427/255.29 |
| 6,867,153 | B2 * | 3/2005 | Tokunaga | 438/800 |
| 6,913,654 | B2 | 7/2005 | Alvarez, Jr. et al. | |
| 7,189,291 | B2 | 3/2007 | Spiegelman et al. | |
| 7,279,067 | B2 * | 10/2007 | Yoshida et al. | 156/345.32 |
| 7,946,800 | B2 * | 5/2011 | Hosek et al. | 414/744.5 |
| 8,272,825 | B2 * | 9/2012 | Hofmeister et al. | 414/217 |
| 8,282,733 | B2 * | 10/2012 | Yamamoto | 117/84 |
| 2005/0103270 | A1 * | 5/2005 | Yoshida et al. | 118/718 |
| 2005/0208777 | A1 * | 9/2005 | Kato et al. | 438/781 |
| 2011/0027052 | A1 * | 2/2011 | Ozawa et al. | 414/217 |
| 2011/0081486 | A1 * | 4/2011 | McCamy et al. | 427/255.19 |

\* cited by examiner

*Primary Examiner* — Saul Rodriguez
*Assistant Examiner* — Brendan Tighe
(74) *Attorney, Agent, or Firm* — Haynes and Boone, LLP

(57) ABSTRACT

The present disclosure provides a system and method for processing a semiconductor substrate wherein a substrate is received at a load lock interface. The substrate is transferred from the load lock interface to a process module using a first module configured for unprocessed substrates. A manufacturing process is performed on the substrate within the process module. Thereafter, the substrate is transferred from the process module to the load lock interface using a second module configured for processed substrates.

5 Claims, 11 Drawing Sheets

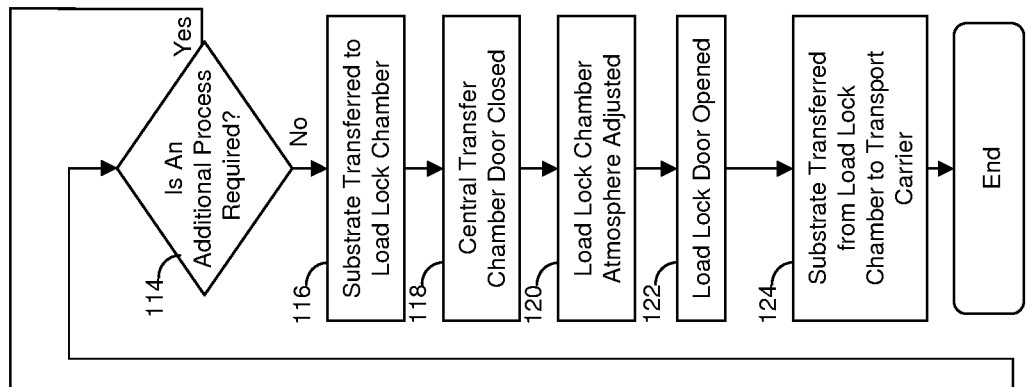
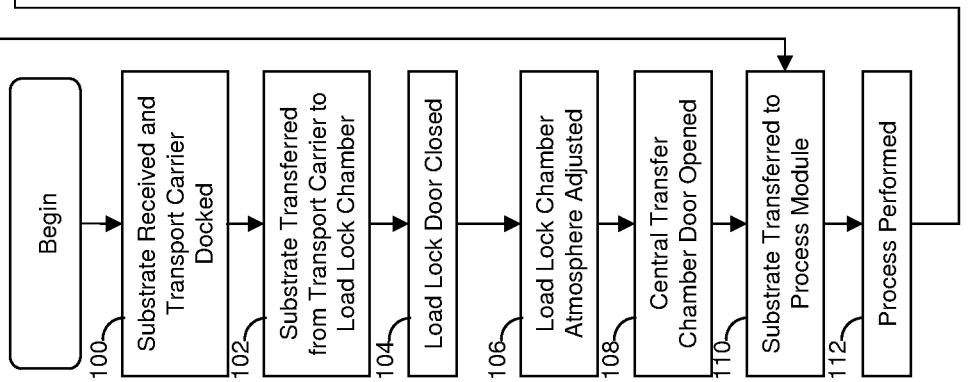
Figure 10
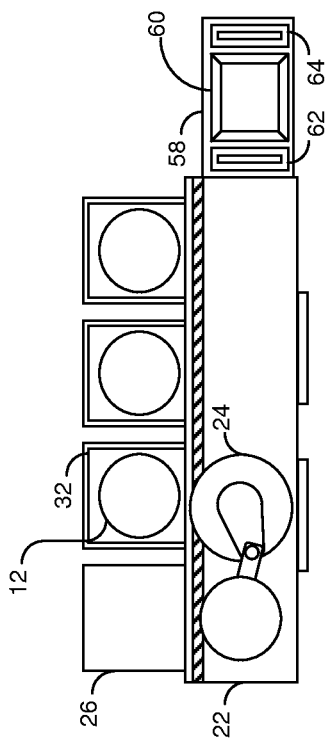
Figure 9

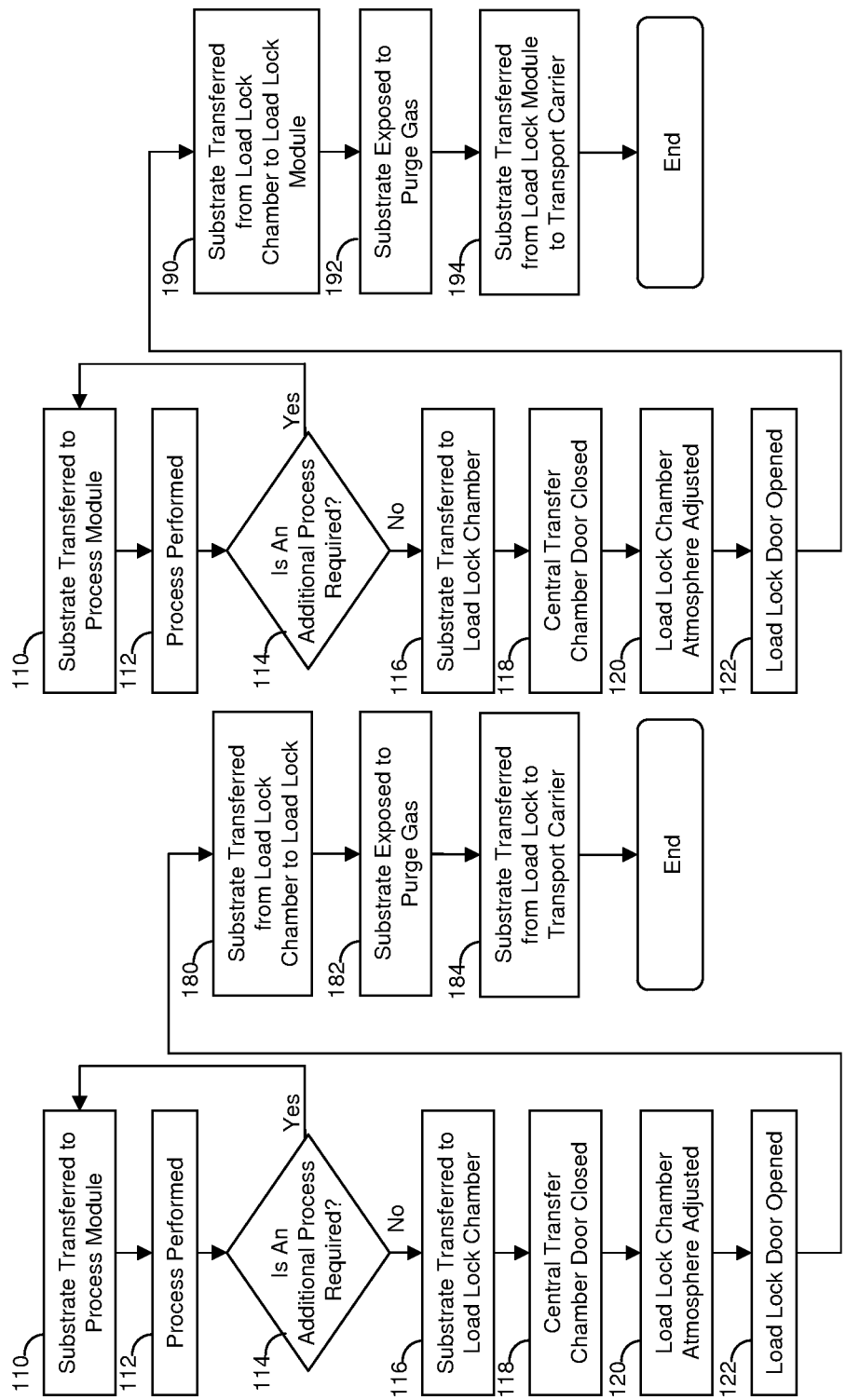

INTEGRATED APPARATUS TO ASSURE WAFER QUALITY AND MANUFACTURABILITY

BACKGROUND

Recent advances in semiconductor performance have been driven in no small part by increased manufacturing precision and reduced device geometries. As feature size shrinks, the associated circuits become more sensitive to contamination during the manufacturing process. The cluster tool has been an important development in semiconductor manufacturing. By providing multiple tools within a single chassis, several manufacturing procedures can be performed on a semiconductor substrate without exposing it to the outside environment. The seals within the cluster tool can be used to create different atmospheric zones. For example, the process modules and the central transfer chamber may operate in a vacuum while the load lock and substrate transport carrier operate in an inert gas atmosphere. Furthermore, because the substrate is never directly exposed to the fab environment, a low particle atmosphere can be maintained around the substrate while the rest of the fab operates with less stringent controls.

The sealed design of the cluster tool protects the substrate from outside contaminants, but outside contaminants are not the only threat to the substrate. Many of the manufacturing procedures carried out within the cluster tool may result in residues that are capable of damaging the substrate. For the purposes of this disclosure, residue may refer to a liquid film, a solid contaminant with or without the potential to outgas, particulate matter, any combination thereof, and/or any other undesirable compound in solid, liquid, or gaseous form. Examples of manufacturing procedures that may leave a residue on the substrate include wet etching, dry etching, ashing, stripping, metal plating, CMP, and/or any other suitable procedure. To illustrate, wet etching procedures apply etchants (e.g., $HNO_3$, HF, KOH, and/or TMAH) to the substrate 12. These etchants may remain on the substrate 12 after etching is completed. Dry etching process gases can include an oxygen-containing gas, fluorine-containing gas (e.g., $NF_3$, $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases or plasmas, and/or combinations thereof. Sulfur, fluorine, chlorine, bromine and other reactive atoms may bond to the photoresist during dry etching and later outgas to form destructive compounds including $SO_2$ and HF. Stripping processes can leave residues of cleaning solutions including $H_2SO_4$ (sulfuric acid) and $H_2O_2$ (hydrogen peroxide).

Residue damage is not limited to direct harm to the substrate through such processes as hazing, erosion, and corrosion. Residue may trap particulate matter, distort lithographic imaging, and prevent other process chemicals from performing a desired effect. Residues can form directly on substrates through manufacturing procedures, can condense on substrates from the ambient environment, and can be deposited by other mechanisms.

Systems and methods to reduce residue and residue vapor have the potential to dramatically improve yield and are of significant value.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 9 is a schematic plan view of a load lock and load lock module in accordance with one embodiment of the present disclosure.

FIG. 10 is a flow diagram of a method for processing a substrate in accordance with one embodiment of the present disclosure.

FIG. 14 is a flow diagram of a method for processing a substrate including performing a gas purge of the substrate in accordance with one embodiment of the present disclosure.

FIG. 15 is a flow diagram of a method for processing a substrate including performing a gas purge of the substrate in accordance with one embodiment of the present disclosure.

DETAILED DESCRIPTION

Figure 2:
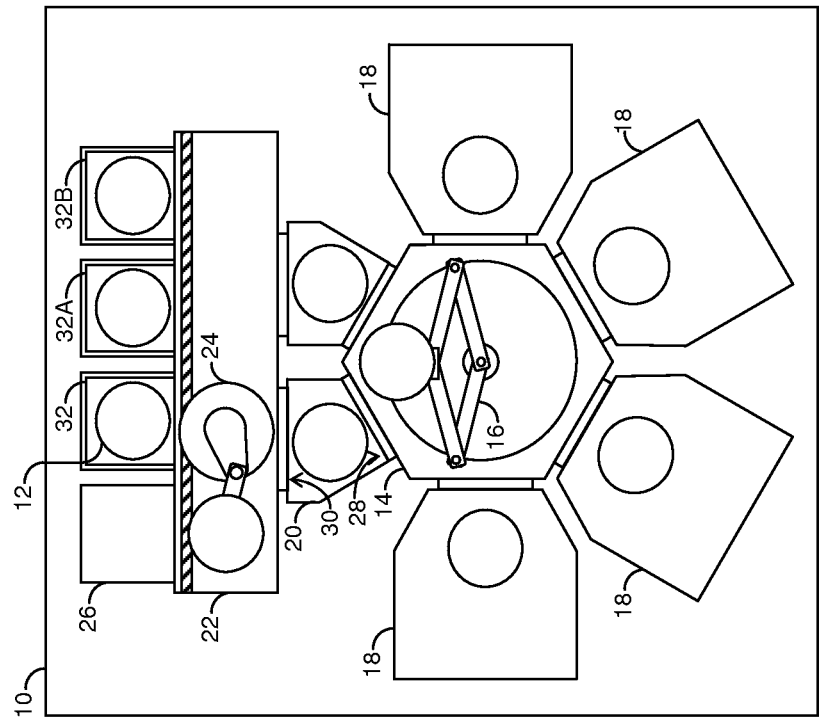
FIG. 2 is a schematic plan view of a cluster tool in accordance with one embodiment of the present disclosure.

It is understood that the following disclosure provides many different embodiments or examples for implementing different features of the invention. Specific examples of components and arrangements are described below to simplify the present disclosure. These are, of course, merely examples and are not intended to be limiting. Some items are shown in a simplified form and inherently include components that are well known in the art. In addition, the present disclosure may repeat reference numerals and/or letters in the various examples. This repetition is for the purpose of simplicity and clarity and does not in itself dictate a relationship between the various embodiments and/or configurations discussed.

Figure 1:
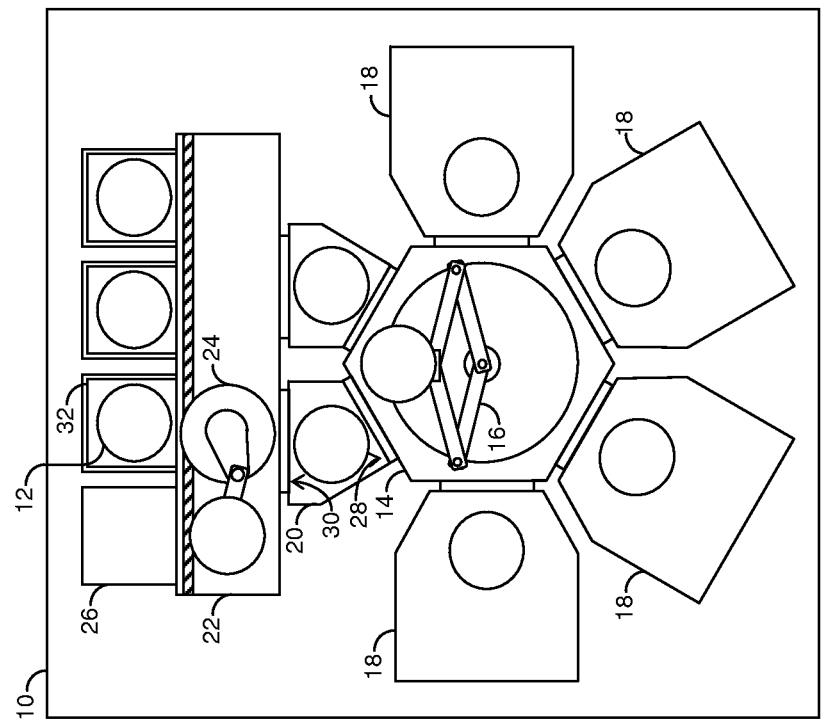
FIG. 1 is a schematic plan view of a cluster tool in accordance with one embodiment of the present disclosure.

Referring to FIG. 1, in one embodiment, a cluster tool 10 is configured to process a substrate 12. The substrate 12 may include one or more semiconductor, conductor, and/or insulator layers. The semiconductor layers may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or gradient such as a substrate in which the ratio of Si and Ge vary across locations. In some embodiments, the substrate 12 may include layered semiconductors. Examples include the layering of a semiconductor layer on an insulator such as that used to produce a silicon-on-insulator ("SOI") substrate, a silicon-on-sapphire substrate, or a silicon-germanium-on-insulator substrate, or the layering of a semiconductor on glass to produce a thin film transistor ("TFT").

The cluster tool 10 includes a central transfer chamber 14 with a central transfer mechanism 16, one or more process modules 18, one or more load lock chambers 20, an equipment front end module (EFEM or load lock) 22 with a load lock transfer mechanism 24, and one or more load ports 26. The central transfer chamber 14 connects to the process modules 18 and to the load lock chambers 20. This configuration allows the central transfer mechanism 16 to transport the substrate 12 between the process modules 18 and the load lock chambers 20.

The process module 18 may be configured to perform any manufacturing procedure on the substrate 12. Substrate manufacturing procedures include deposition processes such as physical vapor deposition ("PVD"), chemical vapor deposition ("CVD"), plasma-enhanced chemical vapor deposition ("PECVD"), electrochemical deposition ("ECD"), molecular beam epitaxy ("MBE"), atomic layer deposition ("ALD") and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (collectively "CMP") processes; testing; any procedure involved in the processing of the substrate 12; and/or any combination of procedures.

The area of the cluster tool 10 defined by the central transfer chamber 14 and the process modules 18 is sealed. Atmospheric controls, including filtering, provide an environment with extremely low levels of particulates and airborne molecular contamination ("AMC"), both of which may damage the substrate 12. By creating a microenvironment within the cluster tool 10, the process modules 18 can be operated in a cleaner environment than the surrounding facilities. This allows tighter control of contaminates during substrate processing at reduced cost.

The load lock chamber 20 preserves the atmosphere within the central transfer chamber 14 and process modules 18 by separating them from the EFEM 22. The load lock chamber 20 includes two doors, a central transfer chamber door 28 and a load lock door 30. The substrate 12 is inserted into the load lock chamber 20 and both doors are sealed. The load lock chamber 20 is capable of creating an atmosphere compatible with the EFEM 22 or the central transfer chamber 14 depending on where the loaded substrate 12 is scheduled to be next. This may require altering the gas content of the load lock chamber 20 by such mechanisms as adding purified gases or creating a vacuum, along with other suitable means for adjusting the load lock chamber atmosphere. When the correct atmosphere has been reached, the corresponding door may be opened, and the substrate 12 can be accessed.

The EFEM 22 provides a closed environment in which to transfer the substrate 12 into and out of the cluster tool 10. The EFEM 22 contains the load lock mechanism 24 which performs the physical transfer of the substrate 12. The substrate 12 is loaded through the load port 26. In the present embodiment, the substrate 12 arrives at the load port 26 contained in a transport carrier 32 such as a front-opening unified pod ("FOUP"), a front-opening shipping box ("FOSB"), a standard mechanical interface ("SMIF") pod, and/or other suitable container. The transport carrier 32 is a magazine for holding one or more substrates and for transporting substrates between manufacturing tools. In some embodiments, the transport carrier 32 may have features such as coupling locations and electronic tags to facilitate use with an automated materials handling system. The transport carrier 32 is sealed in order to provide a microenvironment for the substrate 12 contained within and to protect the substrate 12 and the cluster tool 10 against contamination. To prevent loss of the controlled atmosphere, the transport carrier 32 may have a door specially designed such that the transport carrier 32 remains sealed until it is docked with the load port 26.

Referring to FIG. 2, in one embodiment of a system to reduce substrate contamination, a cluster tool 10 is capable of receiving more than one transport carrier 32. A transport carrier 32A is designated and configured to store and handle only the unprocessed substrate 12. A transport carrier 32B is designated and configured to store and handle the substrate 12 after it has completed a manufacturing procedure or procedures that produce substrate residue. Because the transport carrier 32A has no contact with the processed substrate 12, any other unprocessed substrates in the transport carrier 32A are less likely to be exposed to a processing residue.

Figure 3:
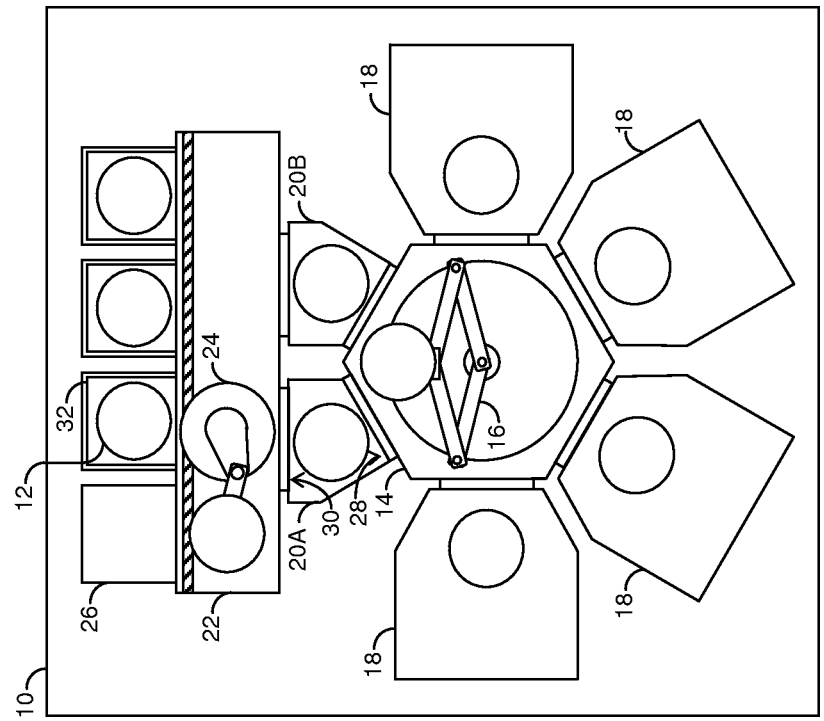
FIG. 3 is a schematic plan view of a cluster tool in accordance with one embodiment of the present disclosure.

Referring to FIG. 3, in another embodiment, a cluster tool 10 includes more than one load lock chamber 20. A load lock chamber 20A is configured to handle the unprocessed substrate 12 only, and a load lock chamber 20B is configured to handle the processed substrate 12. Because load lock chamber 20A does not come in to contact with the processed substrate 12, any subsequent unprocessed substrate that utilizes chamber 20A will not be exposed to residues deposited by the processed substrate 12.

Figure 4:
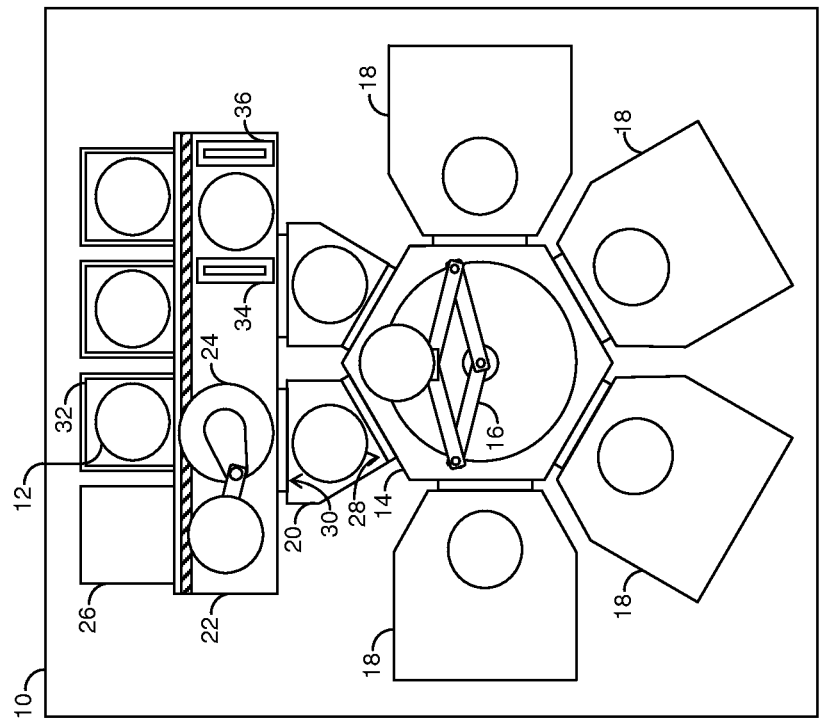
FIG. 4 is a schematic plan view of a cluster tool in accordance with one embodiment of the present disclosure.

Referring to FIG. 4, in another embodiment, the EFEM 22 of the cluster tool 10 is configured to perform a gas purge on the substrate 12. The EFEM 22 further includes a gas inlet nozzle 34 and a gas outlet nozzle 36. An air handler (not shown) supplies purified gas to the EFEM 22 via the gas inlet nozzle 34 and removes contaminated gas via the gas outlet nozzle 36. The gas may remove residue on the substrate 12 by evaporation, reaction with the residue, and/or by mechanically driving the residue from the substrate surface. The air handler may supply an inert gas such as $N_2$, Argon, and/or other noble gases; a reactive gas such as $O_3$, $O_2$, NO, water vapor, and/or clean dry air ("CDA"); other suitable purge gases; and/or any combination thereof. Performing a purge while the substrate 12 is in the EFEM 22 and before the substrate is inserted in the transport carrier 32 reduces the amount of residue which may potentially contaminate the transport carrier 32 once the substrate 12 is inserted.

Figure 5:
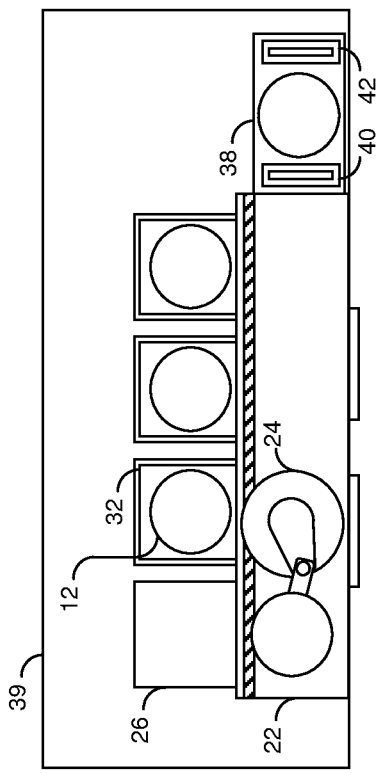
FIG. 5 is a schematic plan view of a load lock and load lock module in accordance with one embodiment of the present disclosure.

Referring to FIG. 5, in another embodiment, the cluster tool 10 may further include a load lock module 38 configured to perform a gas purge on the substrate 12. The EFEM 22, any load ports 26, any docked transport carriers 32, and any attached load lock modules 38 may be collectively referred to as a load lock interface 39. In the current embodiment, the load lock module 38 includes a gas inlet nozzle 40 and a gas outlet nozzle 42. An air handler (not shown) supplies purified gas to the load lock module 38 via the gas inlet nozzle 40 and removes contaminated gas via the gas outlet nozzle 42. The purified gas may include an inert gas such as $N_2$, Argon, and/or other noble gases; a reactive gas such as $O_3$, $O_2$, NO, water vapor, and/or clean dry air ("CDA"); other suitable purge gases; and/or any combination thereof. In some embodiments, the load lock module 38 may have a door to physically separate the load lock module 38 from the EFEM 22. This allows the purge to be performed without contaminating the EFEM 22 or the rest of the cluster tool 10.

Figure 6:
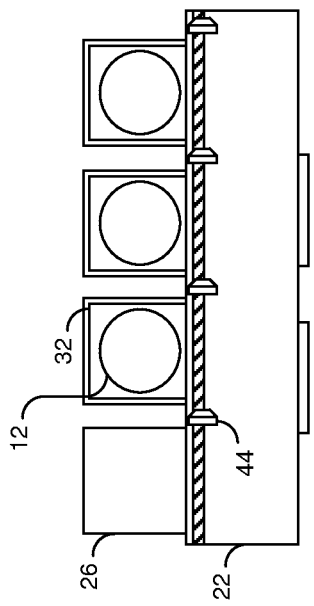
FIG. 6 is a schematic plan view of a load lock in accordance with one embodiment of the present disclosure.

Referring to FIG. 6, in another embodiment, the EFEM 22 further includes an air-door nozzle 44 at the interface between the load port 26 and the EFEM 22. An air handler (not shown) supplies purified gas to the air-door nozzle 44. The air handler may supply an inert gas such as $N_2$, Argon, and/or other noble gases; a reactive gas such as $O_3$, $O_2$, NO, water vapor, and/or clean dry air ("CDA"); other suitable purge gases; and/or any combination thereof. When the transport carrier 32 is docked in the load port 26, the air-door nozzle 44 directs the purified gas such that it creates a physical barrier restricting the flow of air between the transport carrier 32 and the EFEM 22. The directed gas inhibits contaminants in the transport carrier 32 from infiltrating the EFEM 22 and inhibits contaminants in the EFEM 22 from infiltrating the transport carrier 32. In some embodiments, the air-door nozzle 44 may be further used to perform a purge on the substrate 12 as it passes between the transport carrier 32 and the EFEM 22.

Figure 7:
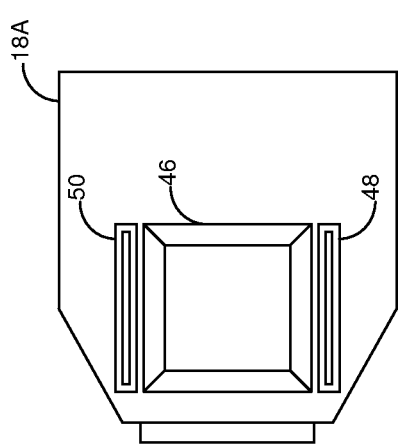
FIG. 7 is a schematic plan view of a process module in accordance with one embodiment of the present disclosure.

Referring to FIG. 7, in another embodiment, a process module 18A is configured to remove halogen contaminants from the substrate 12. Halogen-bearing compounds are commonly used in substrate manufacturing procedures. These include $NF_3$, $CF_4$, $SF_6$, $CH_2F_2$, $CHF_3$, $C_2F_6$, $Cl_2$, $CHCl_3$, $CCl_4$, $BCl_3$, HBr, $CHBr_3$, and/or others. These compounds have the potential to adhere directly to the substrate 12. In addition, the halogen may separate from the compound and bond with the substrate 12. Bound halogens have the potential to outgas later and contaminate other substrates and tools. In the current embodiment, the process module 18A includes an energy source 46. The energy source 46 may be a microwave emitter, a plasma generator, and/or other suitable energy source. In some embodiments, the energy source 46 may be located within the controlled environment of the process module 18A. In some embodiments the energy source 46 may be located outside the controlled environment and separated by a permeable barrier such that the energy source 46 can be serviced without contaminating the controlled environment. The process module 18A may further include a gas inlet nozzle 48 and a gas outlet nozzle 50. The gas inlet nozzle 48 is configured to supply an inert or reactive purge gas. The gas outlet nozzle 50 is configured to remove a contaminated gas. In some embodiments, the gas outlet nozzle 50 may be configured to create a vacuum.

As an example of a halogen removal procedure, the substrate 12 may be treated with microwaves via the energy source 46. The halogen is released from the substrate 12 and evacuated by the outlet nozzle 50. In another example, the substrate 12 may be heated via the energy source in a vacuum of <100 Torr. The heat and vacuum combine to draw the halogen from the substrate 12. As a further example, the gas inlet nozzle 48 may expose the substrate to $H_2$. The energy source 46 in the form of a plasma generator creates H ions from $H_2$. Halogens bound to the substrate 12 reacts to form a gas which can be removed by the gas outlet nozzle 50. The halogen removal procedure may be targeted to a specific halogen including fluorine, chlorine, bromine, iodine, and/or a combination thereof. Further halogen removal procedures will be known to one skilled in the art and do not depart from the scope or spirit of this disclosure.

Figure 8:
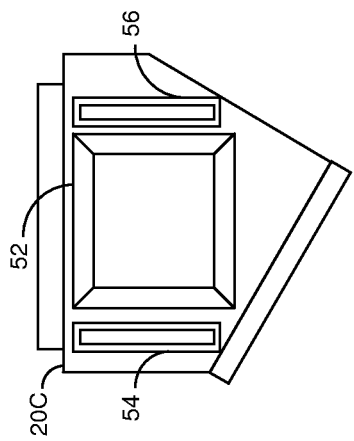
FIG. 8 is a schematic plan view of a load lock chamber in accordance with one embodiment of the present disclosure.

Referring to FIG. 8, in a further embodiment, a load lock chamber 20C is configured to remove halogen contaminants from the substrate 12. The load lock chamber 20C further includes an energy source 52. The energy source 52 may be an ultraviolet light source, a microwave emitter, a plasma generator, and/or other suitable energy source. In some embodiments, the energy source 52 may be located within the confines of the controlled environment of the load lock chamber 20C. In some embodiments the energy source 52 may be located outside the controlled environment and separated by a permeable barrier such that the energy source 52 can be serviced without contaminating the controlled environment. The load lock chamber 20C may further include a gas inlet nozzle 54 and a gas outlet nozzle 56. The gas inlet nozzle 54 is configured to supply an inert or reactive purge gas. The gas outlet nozzle 56 is configured to remove a contaminated purge gas. In some embodiments, the gas outlet nozzle 56 may be configured to create a vacuum.

Referring to FIG. 9, in a further embodiment, a load lock module 58 is configured to remove halogen contaminants from the substrate 12. The load lock module 58 includes an energy source 60. The energy source 60 may be an ultraviolet light source, a microwave emitter, a plasma generator, and/or other suitable energy source. In some embodiments, the energy source 60 may be located within the confines of the controlled environment of the load lock module 58. In some embodiments the energy source 60 may be located outside the controlled environment and separated by a permeable barrier such that the energy source 60 can be serviced without contaminating the controlled environment. In some embodiments, the load lock module 58 may further include a gas inlet nozzle 62 and a gas outlet nozzle 64. The gas inlet nozzle 62 is configured to supply an inert or reactive purge gas. The gas outlet nozzle 64 is configured to remove a contaminated purge gas. In some embodiments, the gas outlet nozzle 64 may be configured to create a vacuum.

Referring to FIG. 10, one embodiment of a method for using the cluster tool 10 proceeds as follows. The cluster tool 10 receives the substrate 12 contained within the transport carrier 32, and the transport carrier 32 is docked to the load port 26 in block 100. The substrate 12 is removed from the transport carrier 32 by the load lock transfer mechanism 24 and inserted into the load lock chamber 20 in block 102. The load lock door 30 is closed in block 104. The environment in the load lock chamber 20 is adjusted to be compatible with that of the central transfer chamber 14 in block 106. Next, the central transfer chamber door 28 is opened in block 108. The central transfer mechanism 16 removes the substrate 12 from the load lock chamber 20 and transfers it to the process module 18 in block 110. One or more manufacturing procedures are performed in the process module 18 in block 112. If another procedure is desired in another process module, the central transfer mechanism 16 will transfer the substrate 12 to the additional process module as illustrated by decision block 114. If not, then the central transfer mechanism 16 will transfer the substrate 12 to the load lock chamber 20 in block 116. The central transfer chamber door 28 is closed in block 118, and the environment in the load lock chamber 20 is adjusted to be compatible with that of the EFEM 22 in block 120. The load lock door 30 is opened in block 122. The substrate 12 is removed by the load lock transfer mechanism 24 and inserted into the transport carrier 32 in block 124.

Figure 11:
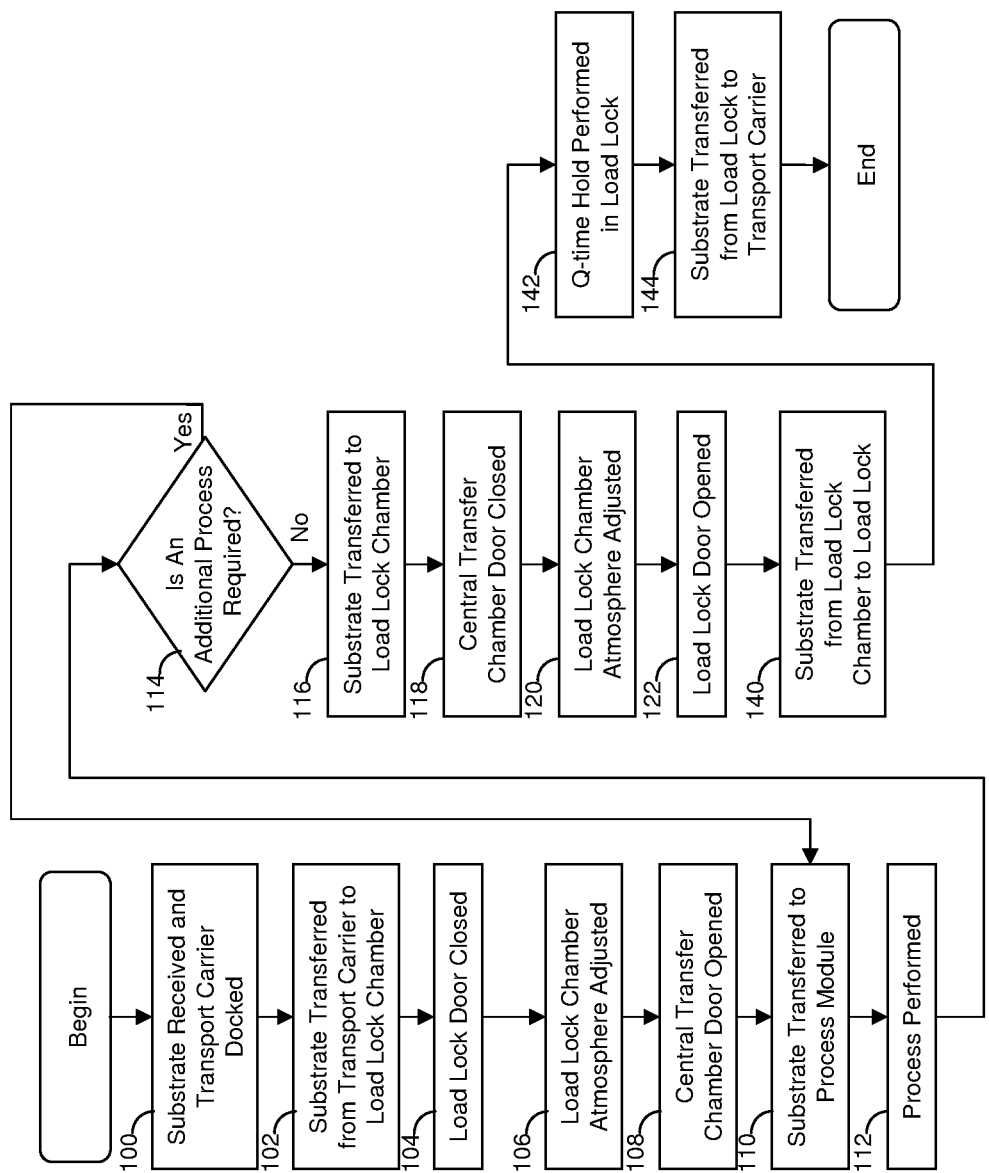
FIG. 11 is a flow diagram of a method for processing a substrate including performing a q-time hold in accordance with one embodiment of the present disclosure.

Referring to FIG. 11, in one embodiment of a method to reduce cross-contamination, a queue-time ("q-time") hold is performed in the EFEM 22. This procedure allows surface residue to evaporate off of the substrate 12. In some embodiments, the q-time hold is combined with a gas purge of the substrate. Performing a q-time hold inside the EFEM 22 before the substrate 12 is inserted into the transport carrier 32 reduces the amount of vaporous residue released in the transport carrier atmosphere. High levels of vaporous residue inside the transport carrier 32 can cause condensation to form on the substrate 12 resulting in hazing, erosion, deposits and other defects. In the present embodiment, after the load lock door 30 is opened in block 122, the load lock transfer mechanism 24 transfers the processed substrate 12 from the load lock chamber 20 to the EFEM 22 in block 140. The load lock transfer mechanism 24 performs a q-time hold on the substrate as illustrated in block 142. The substrate 12 remains inside the EFEM 22 until the contaminants have sufficiently dissipated. Thereafter, the substrate 12 is transferred to the transport carrier 32 in block 144.

Figures 12, 13:
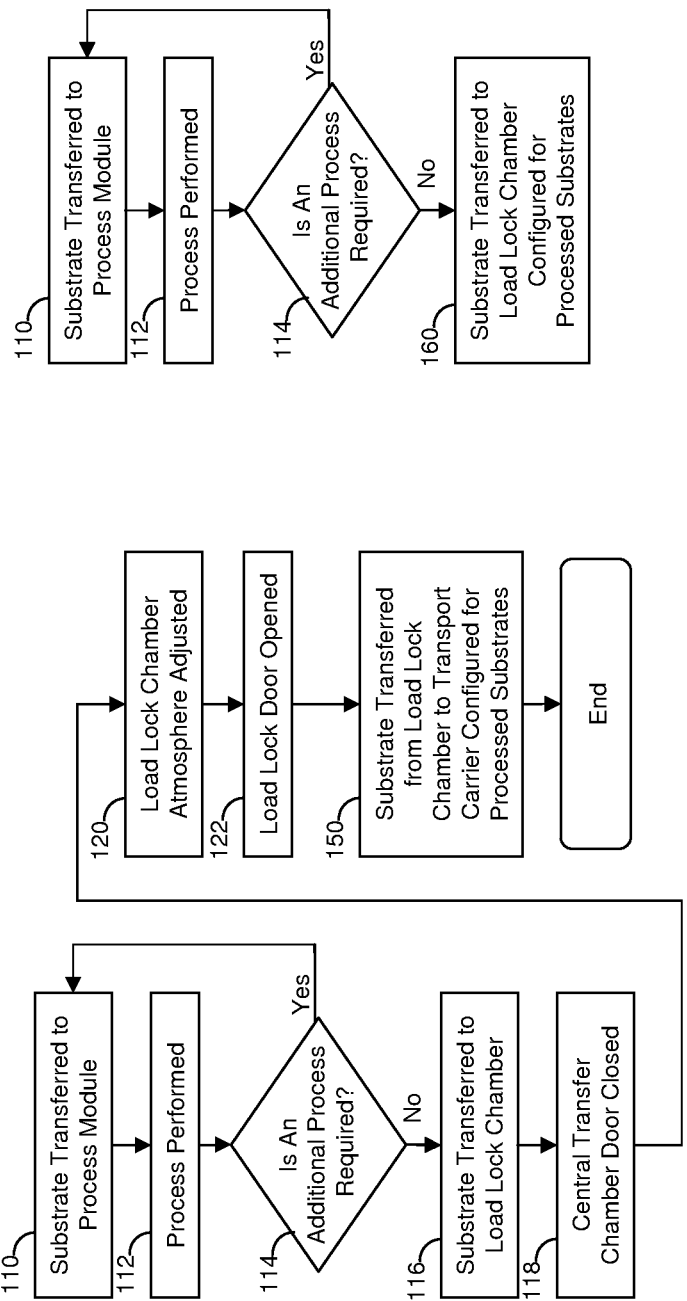
FIG. 12 is a flow diagram of a method for processing a substrate in accordance with one embodiment of the present disclosure.
FIG. 13 is a flow diagram of a method for processing a substrate in accordance with one embodiment of the present disclosure.

Referring to FIG. 12, in another embodiment, two or more transport carriers 32 are used to reduce cross-contamination of unprocessed substrates. Unprocessed substrates are contained in the transport carrier 32A. After processing, the substrate 12 is inserted into the transport carrier 32B configured for processed substrates. This prevents the processed substrate 12 from contaminating the transport carrier 32A. In the present embodiment, after the processed substrate 12 has been returned to the load lock chamber 20 and after the load lock door 30 has been opened in block 122, the processed substrate 12 is transferred to the transport carrier 32B in block 150. Because the transport carrier 32A has no contact with the processed substrate 12, the opportunities for cross-contamination are greatly reduced.

Referring to FIG. 13, in another embodiment, two or more load lock chambers 20 are used to reduce cross-contamination of unprocessed substrates. The unprocessed substrate 12 is inserted in load lock chamber 20A prior to being transferred to the process module 18. After processing, the substrate 12 is inserted into the load lock chamber 20B configured for processed substrates. This prevents the processed substrate 12 from contaminating the load lock chamber 20A. In the present embodiment, if no further processing is required as determined in block 114, the processed substrate 12 is transferred to the load lock chamber 20B configured to handle processed substrates, as shown in block 160. This method reduces the likelihood of substrate contamination in the load lock chamber 20A.

Referring to FIG. 14, in another embodiment, a gas purge is performed on the substrate 12 in the EFEM 22. After the load lock door 30 is opened in block 122, the processed substrate 12 is transferred from the load lock chamber 20 to the EFEM 22 in block 180. A gas purge is performed on the substrate 12 within the EFEM 22 in block 182. The substrate 12 is then transferred from the EFEM 22 to the transport carrier 32 in block 184.

Referring to FIG. 15, in another embodiment, a gas purge is performed on the substrate 12 in the load lock module 38. After the load lock door 30 is opened in block 122, the substrate 12 is transferred from the load lock chamber 20 to the load lock module 38 in block 190. A gas purge is performed on the substrate 12 in block 192. The substrate 12 is then transferred from the load lock module 38 to the transport carrier 32 in block 194.

Figure 16:
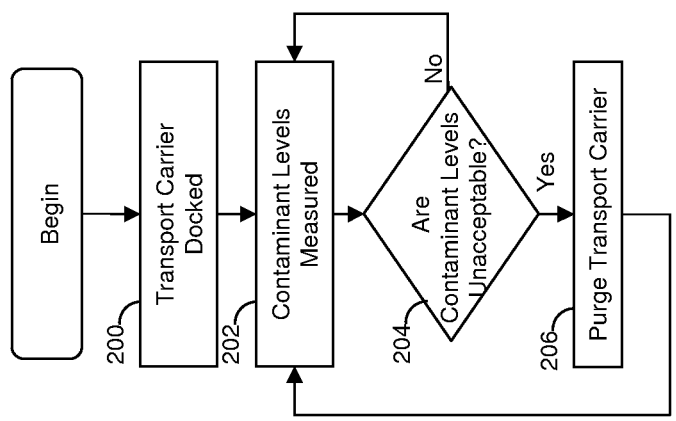
FIG. 16 is a flow diagram of a method for processing a substrate including performing a gas purge of the substrate in accordance with one embodiment of the present disclosure.

Referring to FIG. 16, in another embodiment, a method for reducing contamination includes performing a gas purge of the transport carrier 32. The transport carrier 32 is docked to the load port 26 in block 200. Levels of contaminants in the atmosphere of the transport carrier 32 are measured in block 202. The measurements may be performed by instruments located inside the transport carrier 32, inside the load port 26, inside the EFEM 22, any other suitable location, and/or combination of locations. If the level of contaminants is unacceptable as indicated by decision block 204, the transport carrier 32 is purged with a purified gas in block 206. The purge may be performed with an inert gas such as $N_2$, Argon, and/or other noble gases; a reactive gas such as $O_3$, $O_2$, NO, water vapor, and/or clean dry air ("CDA"); other suitable purge gases; and/or any combination thereof. In some embodiments, the gas purge may be initiated independently of the levels of contaminants such as a gas purge triggered at fixed intervals.

Figure 17:
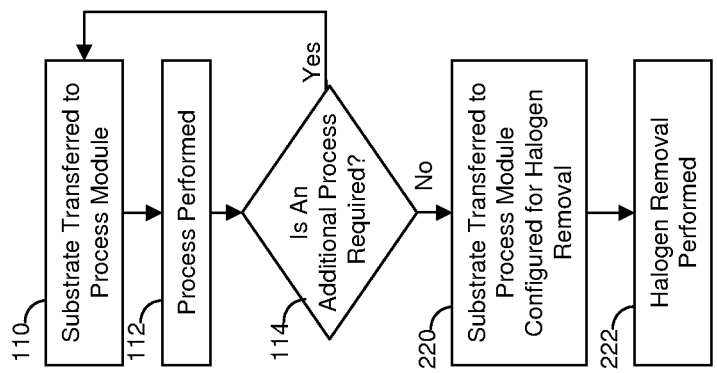
FIG. 17 is a flow diagram of a method for processing a substrate including performing halogen removal procedure in accordance with one embodiment of the present disclosure.

Referring to FIG. 17, in another embodiment, a method for reducing contamination includes performing a halogen removal procedure on the substrate 12 in the process module 18A. After it has been determined that no additional processing is required in decision block 114, the substrate is transferred to the process module 18A configured for halogen removal in block 220. A halogen removal procedure is performed on the substrate 12 in block 222. The halogen removal procedure may include exposing the substrate 12 to microwave radiation; heating the substrate 12 in a vacuum; exposing the substrate to hydrogen ions created by a plasma generator; and/or other halogen removal procedure known to one skilled in the art. The procedure may be targeted to a specific halogen including fluorine, chlorine, bromine, iodine, and/or a combination thereof.

Figures 18, 19:
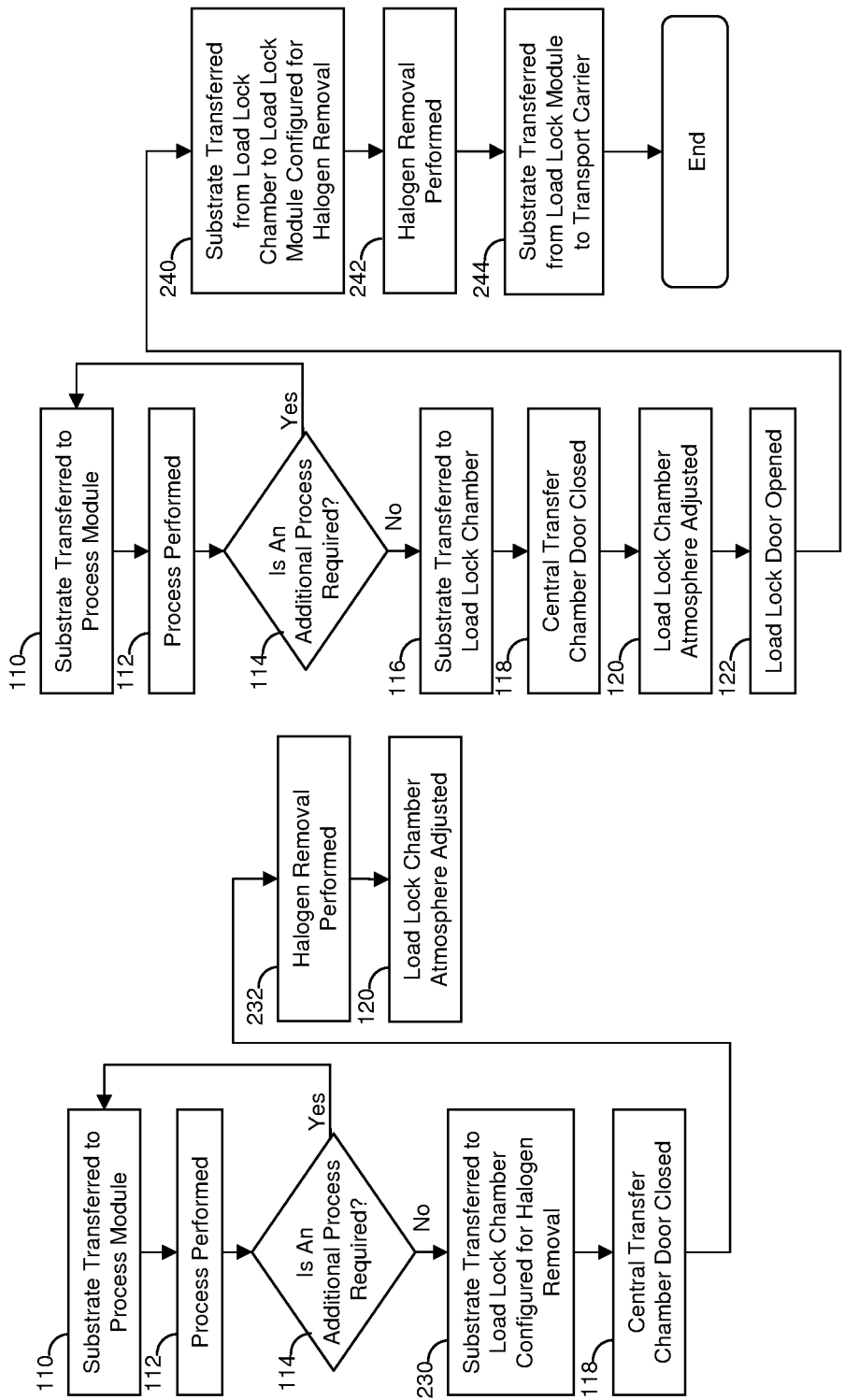
FIG. 18 is a flow diagram of a method for processing a substrate including performing halogen removal procedure in accordance with one embodiment of the present disclosure.
FIG. 19 is a flow diagram of a method for processing a substrate including performing a halogen removal procedure in accordance with one embodiment of the present disclosure.

Referring to FIG. 18, in another embodiment, a method for reducing contamination includes performing a halogen removal procedure on the substrate 12 in the load lock chamber 20C. After the substrate 12 is processed, if no further processing is required as determined in block 114, the substrate 12 is transferred to the load lock chamber 20C configured to remove halogen residues as shown in block 230. The central transfer chamber door 28 is closed in block 118. A halogen removal procedure is performed on the substrate 12 in block 232. The halogen removal procedure may include exposing the substrate 12 to ultraviolet radiation in the presence of $O_3$; exposing the substrate 12 to microwave radiation; heating the substrate 12 in a vacuum; exposing the substrate to hydrogen ions created by a plasma generator; and/or other halogen removal procedure known to one skilled in the art. The procedure may be targeted to a specific halogen including fluorine, chlorine, bromine, iodine, and/or a combination thereof. Thereafter, the load lock chamber atmosphere is adjusted to be compatible with the EFEM 22 in block 120.

Referring to FIG. 19, in another embodiment, a method for reducing contamination includes performing a halogen removal procedure on the substrate 12 in the load lock module 58. After the load lock door 30 is opened block 122, the processed substrate 12 is transferred from the load lock chamber 20 to the load lock module 58 in block 240. A halogen removal procedure is performed on the substrate 12 in block 242. The halogen removal procedure may include exposing the substrate 12 to ultraviolet radiation in the presence of $O_3$; exposing the substrate 12 to microwave radiation; heating the substrate 12 in a vacuum; exposing the substrate to hydrogen ions created by a plasma generator; and/or other halogen removal procedure known to one skilled in the art. The procedure may be targeted to a specific halogen including fluorine, chlorine, bromine, and/or iodine. Thereafter the substrate 12 is transferred from the load lock module 58 to the transport carrier 32 in block 244.

Figure 20:
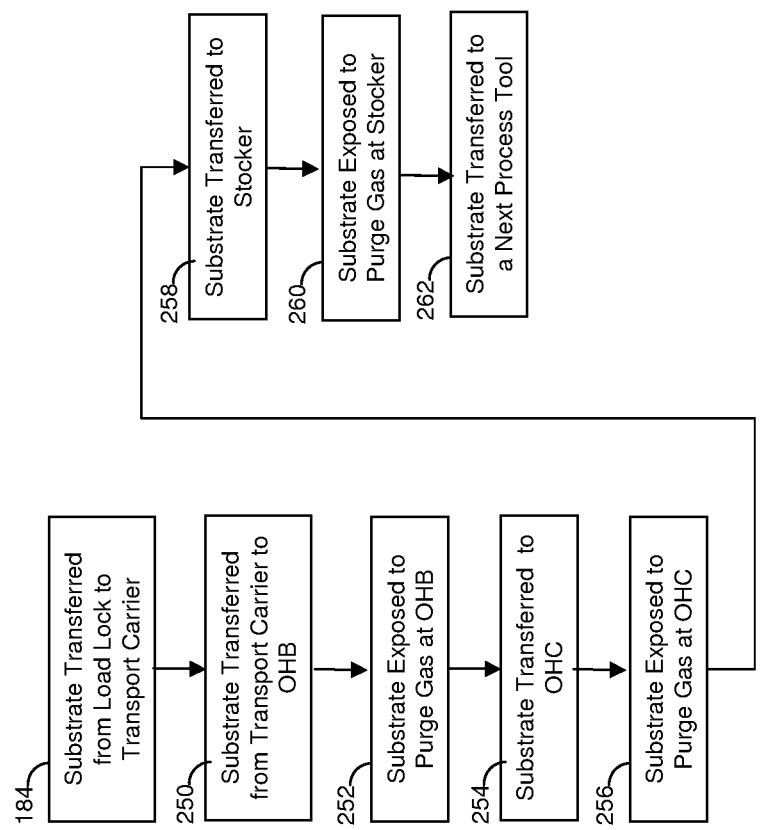
FIG. 20 is a flow diagram of a method for processing a substrate including performing a gas purge of the substrate in accordance with one embodiment of the present disclosure.

Referring to FIG. 20, in another embodiment, a gas purge is performed on the substrate 12 in an over head buffer (OHB), an over head charger (OHC), or a stocker through an automatic material handling system (AMHS). After the substrate 12 is transferred from the EFEM 22 to the transport carrier 32 in block 184, the substrate 12 is transferred to an OHB in block 250. The substrate 12 is then purged in the OHB with a purified gas in block 252. The purge may be performed with an inert gas such as $N_2$, Argon, and/or other noble gases; a reactive gas such as $O_3$, $O_2$, NO, water vapor, and/or clean dry air ("CDA"); other suitable purge gases; and/or any combination thereof. The OHB further includes a gas inlet nozzle and a gas outlet nozzle. An air handler supplies purified gas to the OHB via the gas inlet nozzle and removes contaminated gas via the gas outlet nozzle. The gas may remove residue on the substrate 12 by evaporation, reaction with the residue, and/or by mechanically driving the residue from the substrate surface.

The substrate 12 is transferred to an OHC in block 254. The substrate 12 is purged in OHC with a purified gas in block 256. The OHC further includes a gas inlet nozzle and a gas outlet nozzle. An air handler supplies purified gas to the OHC via the gas inlet nozzle and removes contaminated gas via the gas outlet nozzle. The gas may remove residue on the substrate 12 by evaporation, reaction with the residue, and/or by mechanically driving the residue from the substrate surface.

The substrate 12 is transferred to a stocker in block 258. The substrate 12 is then purged in the stocker with a purified gas in block 260. The substrate 12 is then transferred to another process tool for another process in block 262. The stocker further includes a gas inlet nozzle and a gas outlet nozzle. An air handler supplies purified gas to the stocker via the gas inlet nozzle and removes contaminated gas via the gas outlet nozzle. The gas may remove residue on the substrate 12 by evaporation, reaction with the residue, and/or by mechanically driving the residue from the substrate surface.

In one embodiment, the gas purge is performed in a subset of the OHB, the OHC, and the stocker, depending on the contamination level. In another embodiment, the gas purges performed in the OHB, the OHC, and the stocker are in different sequence, depending on the individual substrate transport procedure supervised by the AMHS. In other embodiments, the methods of FIGS. 10 through 20 are properly combined for optimized effect of cleaning and reducing cross-contamination before, during and after the process.

Thus, the present disclosure provides a method for processing substrates in a cluster tool, the cluster tool including a first process module for performing a first process. In one embodiment, the method includes receiving a substrate at a load lock interface of the cluster tool; transferring the substrate from the load lock interface to the first process module using a first area configured for receiving substrates un-processed by the first process; performing the first process on the substrate within the process module; and thereafter transferring the substrate to the load lock interface using a second area configured for receiving substrates processed by the first process. In some embodiments, the first area is the first transport carrier and the second area is the second transport carrier. In other embodiments, the first module and second areas are load lock chambers.

In some embodiments, the method includes receiving a substrate; transferring the substrate to a process module; performing a manufacturing process on the substrate within the process module; transferring the substrate to a load lock interface; and performing a gas purge of the substrate within the load lock interface. In various embodiments, the gas purge is performed within a load lock and within a load lock module. In further embodiments, the gas purge is performed at an interface between a load lock and a load port.

In some embodiments, the method includes receiving a substrate; transferring the substrate to a process module within a cluster tool; performing a manufacturing process on the substrate within the process module; and performing a halogen removal procedure on the substrate within the cluster tool.

The present disclosure also provides a system for processing substrates. In one embodiment, the system includes a central transfer chamber; a plurality of process modules disposed proximate to the central transfer chamber each operable to perform a manufacturing process on a substrate; a load lock chamber disposed around the central transfer chamber; and a load lock interface including a load lock connected to the load lock chamber and a gas purge apparatus operable to expose a portion of the substrate to a purge gas and remove the purge gas. In various embodiments, the gas purge apparatus is located within the load lock and within a load lock module. In further embodiments, the gas purge apparatus may be configured to direct the purge gas across an interface between the load lock and a load port.

In some embodiments, the system includes a central transfer chamber; and a plurality of modules disposed proximate to the central transfer chamber, the modules including a plurality of process modules each operable to process a substrate; a load lock chamber; and a halogen removal apparatus. In various embodiments, the halogen removal apparatus is located within a process module, within a load lock chamber, and within a load lock module.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A system comprising:
a central transfer chamber;
a plurality of process modules disposed proximate to the central transfer chamber wherein each of the plurality of process modules is operable to perform a semiconductor device fabrication process;
a load lock chamber connected to the central transfer chamber, wherein a first end of the load lock chamber is connected to the central transfer chamber; and
a load lock interface connected to the load lock chamber, wherein the load lock interface is connected to the load lock chamber at a second end, the second end opposing the first end, and wherein the load lock interface includes:
an equipment front end module (EFEM) chamber, wherein the EFEM chamber includes a load lock transfer mechanism operable to transfer the substrate from a load port to the load lock chamber;

the load port connected to the EFEM chamber;

a transport carrier docked in the load port; a measurement instrument operable to measure a level of contaminants in the transport carrier;

a gas delivery apparatus disposed in the load lock interface, wherein the gas delivery apparatus has a gas inlet nozzle on disposed on a first edge of a substrate upon which the semiconductor device fabrication process is performed and a gas outlet nozzle disposed on a second, opposing edge of the substrate, the first and second edge being separated by a diameter of the substrate; and a load lock module connected to the EFEM chamber and having a physical barrier separating the load lock module and the EFEM chamber, wherein the load lock module includes the gas delivery apparatus.

2. The system of claim 1, wherein the measurement instrument is disposed in the EFEM chamber.

3. The system of claim 1, wherein the measurement instrument is disposed in the load port.

4. The system of claim 1, where the gas inlet nozzle and the gas outlet nozzle are disposed in the EFEM chamber.

5. The system of claim 1, wherein the gas delivery apparatus further includes an air-door nozzle at an interface between the load port and the EFEM chamber.

* * * * *